United States Patent
Yoshimura et al.

[11] Patent Number: 6,059,985
[45] Date of Patent: May 9, 2000

[54] METHOD OF PROCESSING A SUBSTRATE AND APPARATUS FOR THE METHOD

[75] Inventors: Takanori Yoshimura, Hino; Shigeru Mizuno, Kawasaki; Shinya Hasegawa, Fuchu; Yoichiro Numasawa, Machida; Nobuyuki Takahashi, Sagamihara, all of Japan

[73] Assignee: Anelva Corporation, Tokyo, Japan

[21] Appl. No.: 08/826,735

[22] Filed: Apr. 4, 1997

[30] Foreign Application Priority Data

Apr. 12, 1996 [JP] Japan .................................... 8-115306

[51] Int. Cl.⁷ .................................................. H01L 21/00
[52] U.S. Cl. .............................. 216/37; 118/723; 156/345
[58] Field of Search ............................. 118/723; 156/345; 216/37

[56] References Cited

U.S. PATENT DOCUMENTS

| | | |
|---|---|---|
| 4,962,049 | 10/1990 | Chang et al. |
| 5,075,256 | 12/1991 | Wang et al. |
| 5,413,669 | 5/1995 | Fujita. |
| 5,453,125 | 9/1995 | Krogh ........................................ 118/723 |
| 5,688,415 | 11/1997 | Bollinger et al. .................. 219/121.41 |
| 5,871,811 | 2/1999 | Wang et al. ......................... 427/248.1 |

FOREIGN PATENT DOCUMENTS

B2-6-70273  9/1994  Japan .

*Primary Examiner*—Richard Bueker
*Assistant Examiner*—Alva C. Powell
*Attorney, Agent, or Firm*—Oliff & Berridge, PLC

[57] ABSTRACT

A method of processing a substrate has the following processes. After depositing a thin film onto a substrate by a CVD method, the front surface of the substrate is brought close to a gas supply surface of a gas supply mechanism to have a desired interval without making contact between the front surface and the gas supply surface. Afterwards, an etching gas is supplied into a back space of the substrate to generate plasma there, and further a purge gas is also supplied into a space between the gas supply surface and the substrate so that the purge gas flows into the back space through a peripheral-edge region of the substrate. This purge gas prevents radicals included in the plasma from diffusing into the space between the gas supply surface and the substrate.

12 Claims, 5 Drawing Sheets

1

METHOD OF PROCESSING A SUBSTRATE AND APPARATUS FOR THE METHOD

BACKGROUND OF THE INVENTION

1. Field of the Invention

The present invention relates to a method of processing a substrate, and more particularly, a method of depositing a thin film made of a metal, such as tungsten, copper, nitride-titanium, titanium and the like, onto a substrate by CVD and of removing afterwards undesired parts of the thin film deposited on the back surface or the peripheral-edge side of the substrate, and further an apparatus suitable for carrying out the foregoing method.

2. Description of the Related Art

In manufacturing semiconductor devices on a substrate (or a wafer), recently, electronic circuit elements such as active elements and the like incorporated in the devices are more and more integrated and miniaturized. As a result, in a metallization process being one of the processes for manufacturing the semiconductor devices, thin film deposition based on a CVD (Chemical Vapor Deposition) method suitable for integration and miniaturization is being used instead of thin film deposition based on the conventional sputtering method.

On the other hand, conventionally, the thin film deposition was carried out to an entire front surface of the substrate to be processed in order to increase the amount of semiconductor-device chips yielded from a single substrate. However, when carrying out the thin film deposition onto the entire front surface of the substrate by using the CVD method in the metallization process as mentioned above, the thin film deposition causes a problem such that the thin films build up on the peripheral-edge side of the substrate and the back surface close to the peripheral edge.

Furthermore, in case of uniformly removing unnecessary or undesired thin films being parts of the thin film which is deposited onto the substrate, so far an etching-back method has been generally used, while a CMP (Chemical Mechanical Polishing) method corresponding to the advanced integration came in use in recent years. The CMP method, however, cannot be used for removing the thin film deposited on the peripheral-edge side of the substrate. Consequently, the thin films deposited on the peripheral-edge side naturally peel off in sequential processes and therefore cause generation of contamination particles which results in a drop in a yield. Then, in case of using the above-mentioned CMP method, the other techniques for removing the thin films deposited on the peripheral-edge side of the substrate is strongly required in order to decrease the generation of the contamination particles.

A typical conventional technique for removing the thin film deposited on the peripheral-edge side of the substrate is conceptually explained by referring to FIG. 5. This conventional technique relates to a CVD apparatus used for depositing a thin film made of e.g. a blanket tungsten on the entire front surface of the substrate.

A gas supply section 52 with a gas supply plate 53 is arranged at an upward position in a reactor 51, and the gas supply plate 53 has a plurality of projecting sections 61 at predetermined positions in a lower surface of the plate 53, which project in vertical direction. A bottom shape of the gas supply plate 53 is circular, for example, and in the plate 53 a plurality of gas inlets are formed in the region between a center and a peripheral section in a suitable arrangement. The plurality of projecting sections are arranged in a circle in the lower surface at a constant interval. The diameter of the circle on which the projecting sections are placed is slightly smaller than the diameter of the substrate. A substrate holder 54 whose upper surface is opposite to the gas supply plate 53 is placed in the inside region of the reactor 51. The upper surface of the substrate holder 54 is used as a substrate loaded surface with an almost circular shape. The substrate holder 54 has a heating device 55 in its inside and further receives a radio frequency (rf) power supplied by a radio frequency power supplying device 59. A reference number 55a designates an electric power generator for supplying power to the heating device 55.

A substrate 58 with a disk shape is placed on the upper surface of the substrate holder 54 and afterwards a thin-film deposition process is started. In the thin-film deposition process, a process gas is supplied into the reactor 51 from the gas supply section 52 and a tungsten thin film can be deposited on an entire front surface of the substrate 58 by the CVD method. On this occasion of the thin film deposition, the thin film can be naturally deposited on the peripheral-edge side of the substrate 58, and furthermore, on the back surface thereof.

Then, a process for removing the tungsten thin films stuck to the peripheral-edge side and the back surface of the substrate 58 follows. In this removal process, the substrate is processed in the reactor of the conventional apparatus, as described below. That is, in brief, the substrate 58 can be etched by radicals generated in the plasma.

Rods 60 for pushing up the substrate 58 lift it from the substrate holder 54, and the peripheral edge in front of the substrate 58 is pressed to the projecting sections 61 of the gas supply plate 53. The rods 60 are called "push-up rods" hereinafter. The push-up rods 60 can be activated by a substrate push-up rod driver 62. Further, the push-up rods 60 are arranged to pass the substrate holder 54, and electrically insulated from the substrate holder 54.

Next, the gas supply section 52 introduces an etching gas into a space between the gas supply plate 53 and the front surface of the substrate 58. There are clearances between the front surface of the substrate 58 and the gas supply plate 53 with the exception of the places where the projecting sections 61 exist. The etching gas introduced into the space between the substrate 58 and the gas supply plate 53 flows into the interior space of the reactor 51 through the clearances, and is evacuated afterwards to the outside through an evacuation section 56.

Next, the rf power is applied to the substrate holder 54 by the rf power supply device 59, and thereby, plasma can be generated in both spaces between the back surface of the substrate 58 and the substrate holder 54 and between the gas supply section 52 and the substrate holder 54. The radicals generated by the plasma, which can reach the substrate 58, remove the tungsten thin films deposited on the back surface and peripheral-edge side of the substrate.

The substrate 58 pressed against the projecting sections 61 in contact electrically with each other is kept to have an electrical potential equal to that of the gas supply plate 53, that is, an earth potential. Accordingly, even if the rf power is applied to the substrate holder 54, the plasma is not generated in the space between the substrate 58 and the gas supply plate 53. However, if there is electrically imperfect contact between the substrate 58 and the gas supply plate 53, the electrically imperfect contact causes a potential difference between them, and the plasma may be generated in the space formed between them. Therefore, the generation of the plasma between the substrate 58 and the gas supply plate 53 is more restrained by keeping the distance between the substrate 58 and the gas supply plate 53 smaller than the predetermined distance which makes the plasma generation difficult.

In the above-mentioned conventional arts, the rf power is applied to the substrate holder 54, while the gas supply section 52 is grounded. Conversely, the rf power may be applied to the gas supply section 52, while the substrate 58 may be grounded.

As other similar conventional arts, there are Tokko-Hei 6-70273 (Tokkai-Hei 3-97869; this reference corresponds to U.S. Pat. No. 5,075,256) and U.S. Pat. No. 4,962,049, for example. In the apparatus according to Tokko-Hei 6-70273 (Tokkai-Hei 3-97869), the substrate (wafer) on which the thin film has been deposited is placed so as to be in contact with the projecting sections formed on the lower surface of the face plate as a gas supply plate, and the process gas (etching gas) is supplied from the face plate in order to remove the films deposited on the backside and edge side of the substrate. Further, U.S. Pat. No. 4,962,049 shows the configuration that the semiconductor wafer is supported by the pins at the upper position above the conductive cathode at predetermined intervals, and the back surface of the wafer is processed by the plasma.

In the conventional apparatus firstly explained by referring to FIG. 5, the plasma used for the etching process in the reactor 51 can be generated in a region close to the peripheral edge of the substrate 58 and between the gas supply plate 53 and the substrate holder 54. In addition, there is the possibility that the plasma flows into the region near to the peripheral edge of the front surface of the substrate 58 through the clearances formed between the substrate 58 and the gas supply plate 53. Therefore, it causes a problem that most of the radicals produced by the plasma diffuse and enter into the space above the front surface of the substrate 58, and the tungsten thin film deposited on the front surface of the substrate is removed.

Further, since the substrate surface onto which the tungsten thin film is deposited is pressed to the projection sections 61, an easy to peel-off thin film such as the tungsten thin film e.g. causes contamination particles which produces a yield drop.

SUMMARY OF THE INVENTION

The object of the present invention is to solve the above problems, and to provide a method of processing a substrate and the apparatus therefor, being capable of removing only deposits on the back surface and the peripheral-edge side of the substrate without damaging the thin film deposited on the front surface thereof, because of not causing the front surface to come into contact with other sections having the earth potential, and because of decreasing the contamination particles as much as possible, which cause yield drops in sequent semiconductor device manufacturing processes.

The present inventions is directed to a method of processing a substrate and an apparatus for carrying out the method in order to attain the above object.

A method of processing a substrate in accordance with the present invention, is configured that, after depositing a thin film onto the substrate by the CVD method, a front surface of the substrate is brought close to a gas supply surface of a gas supply mechanism without making contact between the front surface and the gas supply surface, and an etching gas is supplied into a back space of the substrate to generate plasma there, and further a purge gas is also supplied into a space between the gas supply surface and the substrate so that the purge gas flows into the back space through a peripheral edge region of the substrate, whereby the purge gas prevents radicals included in the plasma from diffusing into the space between the gas supply surface and the substrate.

In the method of processing a substrate, when removing undesired thin films deposited on the back surface and peripheral-edge side of the substrate after a thin film deposition process, the plasma is generated in the back space of the substrate on the basis of the etching gas supplied into the back space, and the radicals in the plasma are used.

On the other hand, the thin film deposited onto the front surface of the substrate is prevented from being removed, since the front surface is brought close to the gas supply surface of the gas supply mechanism at a narrow interval which can not cause the plasma to be generated, and the purge gas is supplied into a narrow space between the front surface and the gas supply surface through the gas supply surface in order to prevent the radicals from entering into the space above the front surface. Thereby, only the deposits on the back surface and peripheral-edge side can be removed.

In the method of processing a substrate, the substrate may be allowed to come near the gas supply surface.

In the method of processing a substrate, the gas supply surface may be allowed to come near the substrate.

In the method of processing a substrate, the interval between the gas supply surface and the substrate may be not more than 1 mm. The clearance having this interval can prevent a plasma generation in the space between the substrate and the gas supply surface.

In the method of processing a substrate, further preferably, a cylindrical member may be used for preventing the radicals in the plasma from diffusing to the front surface of the substrate, which is arranged to surround the substrate when both the substrate and the gas supply surface approach.

An apparatus for processing a substrate in accordance with the present invention is provided for being applied to a film deposition apparatus in which a thin film is deposited onto a substrate loaded on a substrate holder by the CVD method, and comprises a purge gas supply mechanism having a gas supply surface through which a purge gas is blown off; an approach driving mechanism for reducing the distance between the substrate and the gas supply surface; and an etching gas supply mechanism for supplying an etching gas into the space between the purge gas supply mechanism and the substrate holder. In this configuration, after the thin film is deposited onto the front surface of the substrate, the gas supply surface and the front surface of the substrate are brought close without making contact with each other by the approach driving mechanism, and the etching gas supplied into the back space of the substrate by the etching gas supply mechanism generates the plasma. Furthermore, the purge gas is supplied into the space between the gas supply surface and the substrate through the gas supply surface of the purge gas supply mechanism, and the purge gas is allowed to flow into the back space of the substrate through the peripheral-edge. The flow of the purge gas prevents the radicals included in the plasma from diffusing or entering into the space between the gas supply surface and the substrate. This apparatus is used for performing the above-mentioned method of processing the substrate. The operation of the apparatus is substantially identical to the contents of the method.

In the apparatus, preferably, the approach driving mechanism (a substrate push-up rod driver and substrate pushup rods) causes the substrate to come close to the gas supply surface.

In the apparatus, preferably, the approach driving mechanism causes the gas supply surface to come close to the substrate.

In the apparatus, the distance between the gas supply surface and the substrate is designed to be not more than 1

In the apparatus, further preferably, a cylindrical member may be fixed to the gas supply surface so as to be placed around the substrate which is brought close to the gas supply surface, in order to prevent the radicals in the plasma from diffusing into the front surface of the substrate.

In accordance with the apparatus of the present invention, when removing undesired deposits on the back surface or the peripheral-edge side of the substrate after depositing a predetermined thin film onto the substrate by the CVD method, only the undesired deposits can be removed without removing the thin film deposited onto a central section or edge side of the front surface of the substrate, because the substrate is brought close to the gas supply surface at the predetermined interval not to cause the plasma generation in non-contact mode, and in addition the necessary amount of purge gas is caused to flow into the backspace of the substrate through the space between the gas supply surface and the substrate. Further, since there are no contact portions between the gas supply surface and the substrate and the easy to peel-off thin films are not formed, particle contamination can not be generated in the sequent processes.

Furthermore, in the process of removing the deposits on the back surface and peripheral-edge side of the substrate, since the cylindrical or ring-shaped member with a suitable dimension in its axial direction is arranged around the substrate to control the flow of the purge gas and thereby to control the diffusion of the radicals, the removal of the thin film in the region close to the peripheral-edge side of the substrate can be performed suitably.

In addition, the apparatus has separately a supply route used for supplying the etching gas which causes the plasma to be generated in the back space of the substrate in order to remove the unnecessary deposits and another supply route for supplying the purge gas which prevents the thin film deposited on the front surface of the substrate from being removed. Therefore, the flow amount of the etching gas can be easily controlled and the etching gas can surely prevent the invasion of the radicals within the plasma to the front side of the substrate in most desirable state.

DESCRIPTION OF THE PREFERRED EMBODIMENTS

In accordance with the accompanying drawings, some preferred embodiments of the present invention will be explained hereinafter.

Figure 1:
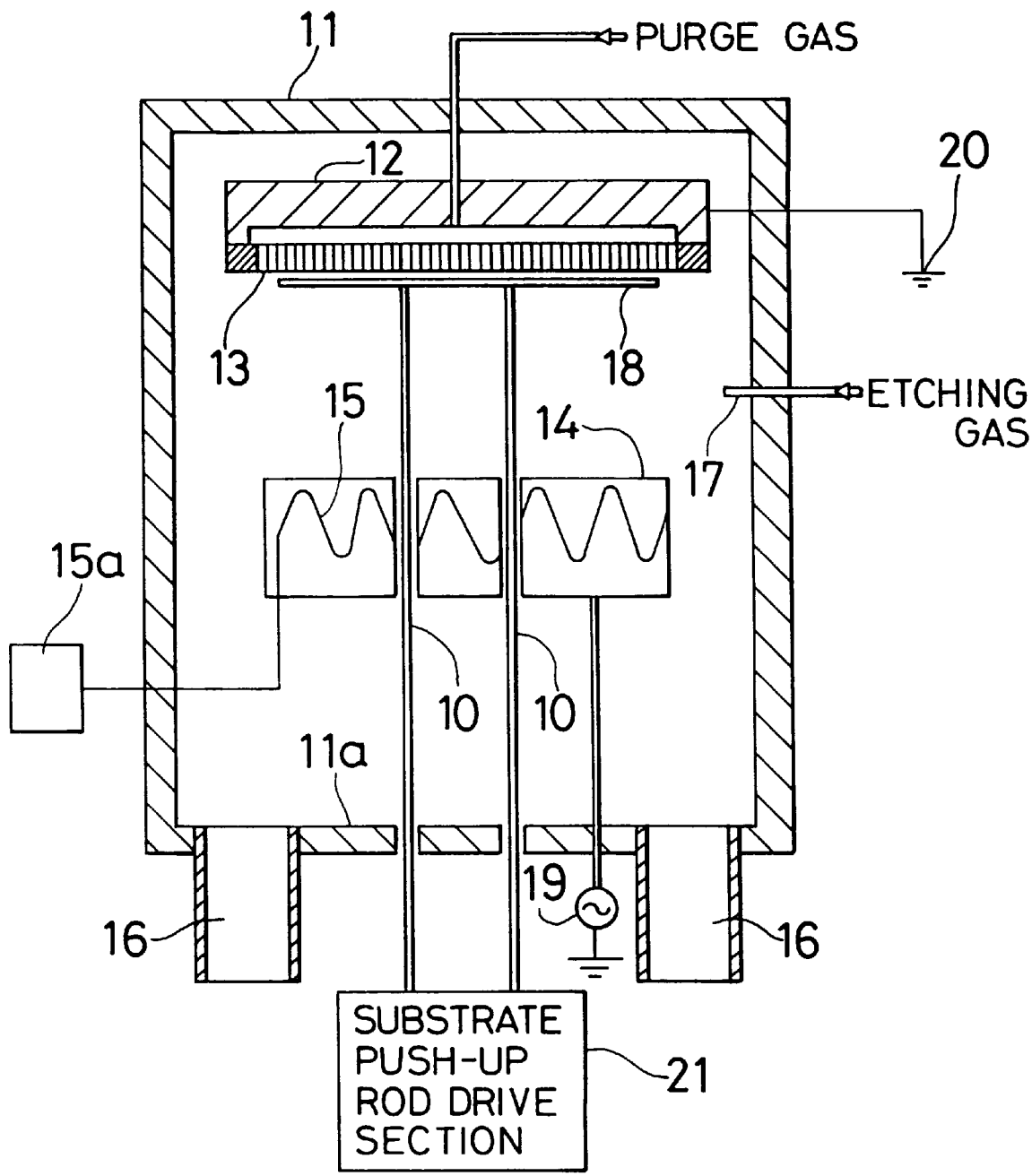
FIG. 1 is a longitudinal sectional view schematically showing a first embodiment of the present invention.

A substrate processing apparatus shown in FIG. 1 is used for depositing a thin film, e.g. blanket tungsten thin film onto an entire front surface of a substrate by a CVD method. This substrate processing apparatus is referred to as a CVD apparatus. In the CVD apparatus, thin films are built up on a back surface or a peripheral-edge side of the substrate after the process of depositing the thin film is finished. The process of removing unnecessary thin films as deposits from the back surface and the peripheral-edge side of the substrate after the thin film deposition process is one of the processes carried out in the CVD apparatus.

In a reactor 11 the substrate is processed by the CVD method. The reactor 11 has a gas supply section 12 at its upper side, and a substrate holder 14 almost at its central place, for example. Each of supporting mechanisms for the gas supply section 12 and the substrate holder 14 is omitted from the figure. The gas supply section 12 is provided with predetermined gases from the outside of the reactor 11, the gas supplied through the gas supply section 12 is a process gas in the process of depositing the thin film onto the substrate, while the gas is a purge gas in the process of removing the above-mentioned unnecessary thin films from the substrate. The gas supply section 12 has a gas supply plate 13 at its lower section, through which the gases are blown off into the reactor 11. The bottom surface of the gas supply plate 13 faces the top surface (substrate-loaded surface) of the substrate holder 14 placed at a lower position in the reactor 11. Both the gas supply section 12 and gas supply plate 13 are grounded. A reference numeral 20 designates the state of grounding. Before depositing the thin film onto the substrate, the substrate is loaded on the top surface and fixed there by a fixing device (not shown). The substrate holder 14 includes a heating mechanism 15 which is supplied with electric power from a power source 15a arranged in the outside of the reactor 11. An rf electric power supply mechanism supplies rf electric power to the substrate holder 14. Further, an etching gas introduction section 17 for introducing an etching gas is arranged at a part of the side wall of the reactor 11, which corresponds to the space between the substrate supply plate 13 and the substrate holder 14.

A plurality gas outlets are formed in the bottom surface of the gas supply plate 13 at a suitable interval. As mentioned above, in the process of removing the unnecessary thin films from the substrate the purge gas is blown off through the gas outlets. A single gas of inert gases such as $N_2$, He, Ne, Ar, Kr and Xe, or a mixed gas composed of any combination of those inert gases, are used as the purge gas. Further, as the etching gas, a single gas such as $NF_3$, $SF_6$, $CF_4$, $C_2F_6$, or a mixed gas composed of any combination of those gases, are used.

There are evacuation sections 16 connecting with an evacuation mechanism (not shown) at a bottom wall 11a of the reactor 11. There is a substrate push-up drive section 21 under the reactor 11. The substrate push-up drive section 21 has at least two and preferably three substrate push-up rods 10 which are arranged to pass through the bottom wall 11a of the reactor 11. These substrate push-up rods 10 can be extended upward to pass through insert holes formed in the substrate holder 14. The tip of the substrate push-up rod 10 is usually placed under the top surface of the substrate holder 14, or the substrate loaded surface. If needed, the substrate push-up rods 10 move upward by the operation of the substrate push-up drive section 21 and the tips thereof are caused to extend upward over the top surface of the substrate holder 14. The state of the apparatus shown in FIG. 1 shows that the substrate 18 which has been loaded on the top surface of the substrate holder 14 is moved by the upwardly extended push-up rods 10 and is placed to be close to the bottom surface of the gas supply plate 13.

In the above-mentioned configuration, the rf electric power may be applied to the gas supply section 12. Also, airtightness and electric insulation are maintained between the substrate push-up rods 10 and the bottom wall 11a of the reactor 11, and further the electric insulation is maintained between each of the substrate push-up rods 10 and the substrate holder 14.

Next, the thin film deposition process and the process of removing the thin film deposited on the back surface and peripheral-edge side of the substrate carried out in the CVD apparatus having the above-mentioned configuration will be explained.

In the state that the substrate 18 is fixed on the substrate holder 14, the film deposition process is carried out as follows. The diameter of the substrate 18 is 6 inches, for example. The process gas is supplied through the gas supply section 12, and the thin film of tungsten is deposited onto the entire front surface of the substrate 18 facing the gas supply plate 13.

In the thin film deposition like a blanket tungsten thin film, for example, ordinary conditions in the stage of generating initial formation cores for the film deposition are: a 2–10 sccm flow rate for $WF_6$ as a process gas; a 2–10 sccm flow rate for $SiH_4$; and 0.5–10 Torr for the film deposition pressure. Next, ordinary conditions in the following stage of depositing a comparatively thick film based on reduction of $H_2$ are: a 50–200 sccm flow rate for $WF_6$ as a process gas; a 500–2000 sccm flow rate for $H_2$; 30–70 Torr for film deposition pressure; 400–500° C. for substrate temperature; and two minutes for film deposition time. The thickness of the tungsten thin film formed by the thin film deposition process with the above-mentioned conditions is about 1 $\mu$m.

After the tungsten thin film with a desirable thickness is formed onto the entire front surface of the substrate 18, the process in accordance with the present invention, that is, the process for removing the tungsten thin film deposited on the back surface and the peripheral-edge side of the substrate 18, is carried out as follows.

At first, the substrate 18 is lifted by the substrate push-up rods 10 from the substrate holder 14 so that the interval between the front surface of the substrate 18 and the gas supply plate 13 is held to be equal to or less than 1 mm, which is a sufficiently narrow distance capable of preventing a plasma from generating in the space defined by the interval. A plasma can be generally generated in a space between an electrode plate supplied with an rf electric power and an object electrically grounded. However, under the condition that a pressure in the space where the plasma tends to be generated is less than 1 Torr, if the interval of the space as a gap is equal to or less than 1 mm, it is well known that the plasma is never generated in the space. In accordance with this fact, the apparatus of this embodiment, which is so configured that the interval between the substrate 18 and the gas supply plate 13 is held to be equal to or less than 1 mm by lifting the substrate 18 close to the gas supply plate 13 by the substrate push-up rods 10, can prevent a plasma from being generated in the space between the substrate 18 and the gas supply plate 13, or another plasma from entering into the space from the outside.

Next, the purge gas is introduced through the gas supply section 12 and the etching gas is also introduced through the etching gas introduction section 17. Both the purge gas and the etching gas flow in the inside of the reactor 11 and are evacuated through the evacuation sections 16. The etching gas is used for vaporizing and removing the tungsten thin film based on the reaction between the etching gas and the tungsten thin film, as mentioned below. In accordance with the configuration of this embodiment, the etching gas removes only the tungsten thin films built up on the back surface and the peripheral-edge side of the substrate 18.

After introducing the etching gas into the reactor 11, the rf electric power is applied to the substrate holder 14 so as to generate a plasma in the space between the substrate holder 14 and the gas supply plate 13. The plasma causes a part of the etching gas to be changed into ions and radicals. The radicals remove the tungsten thin films on the back surface and the peripheral-edge side of the substrate 18. Further, the radicals tend to diffuse into the gap between the peripheral-edge of the substrate 18 and the gas supply plate 13. However, as mentioned above, the purge gas which is introduced through the gas supply section 12 is blown off from the gas supply plate 13. This purge gas flows between the gas supply plate 13 and the film-deposited front surface of the substrate 18 and is blown off into the interior of the reactor 11 through the peripheral-edge of the substrate 18, and therefore the radicals are prevented from diffusing or entering to the front surface of the substrate 18 by the purge gas. Thus, only the tungsten thin films on the back surface and the peripheral-edge side of the substrate 18 can be removed.

In the above-mentioned configuration, the amount of the radicals diffusing from the region near to the peripheral-edge to the inside region on the substrate 18 can be controlled by adjusting the flow of the purge gas blown off from the gas supply plate 13. That is, the diffusion amount of the radicals is decreased when increasing the flow of the purge gas, and on the contrary it is increased when decreasing the flow of the purge gas. The diffusion amount of the radicals can change a range to be etched near to the peripheral-edge of the substrate 18. The etched range near to the peripheral-edge of the substrate 18 can be ultimately controlled by adjusting the diffusion amount of the radicals by the purge gas.

In accordance with the above-mentioned configuration, only the tungsten thin films built up on the back surface and the peripheral-edge side of the substrate 18 can be removed, and the tungsten thin film deposited on the region from the peripheral-edge to the inside on the front surface of the substrate 18 are prevented from the removal.

The conditions for the removal process according to the above-mentioned embodiment are: for example, a 100 sccm flow rate for the etching gas $CF_4$; a 90 sccm flow rate for $O_2$; a 100 scam flow rate for Ar as the purge gas; 0.86 Torr for the film deposition pressure; a 200–300 W for the rf electric power; and 1 minute for the processing time. As a result of the experiment based on the processing conditions, only the tungsten thin films on the back surface and peripheral-edge side of the substrate 18 were completely removed without removing the tungsten thin film deposited onto the front surface of the substrate 18.

Figure 2:
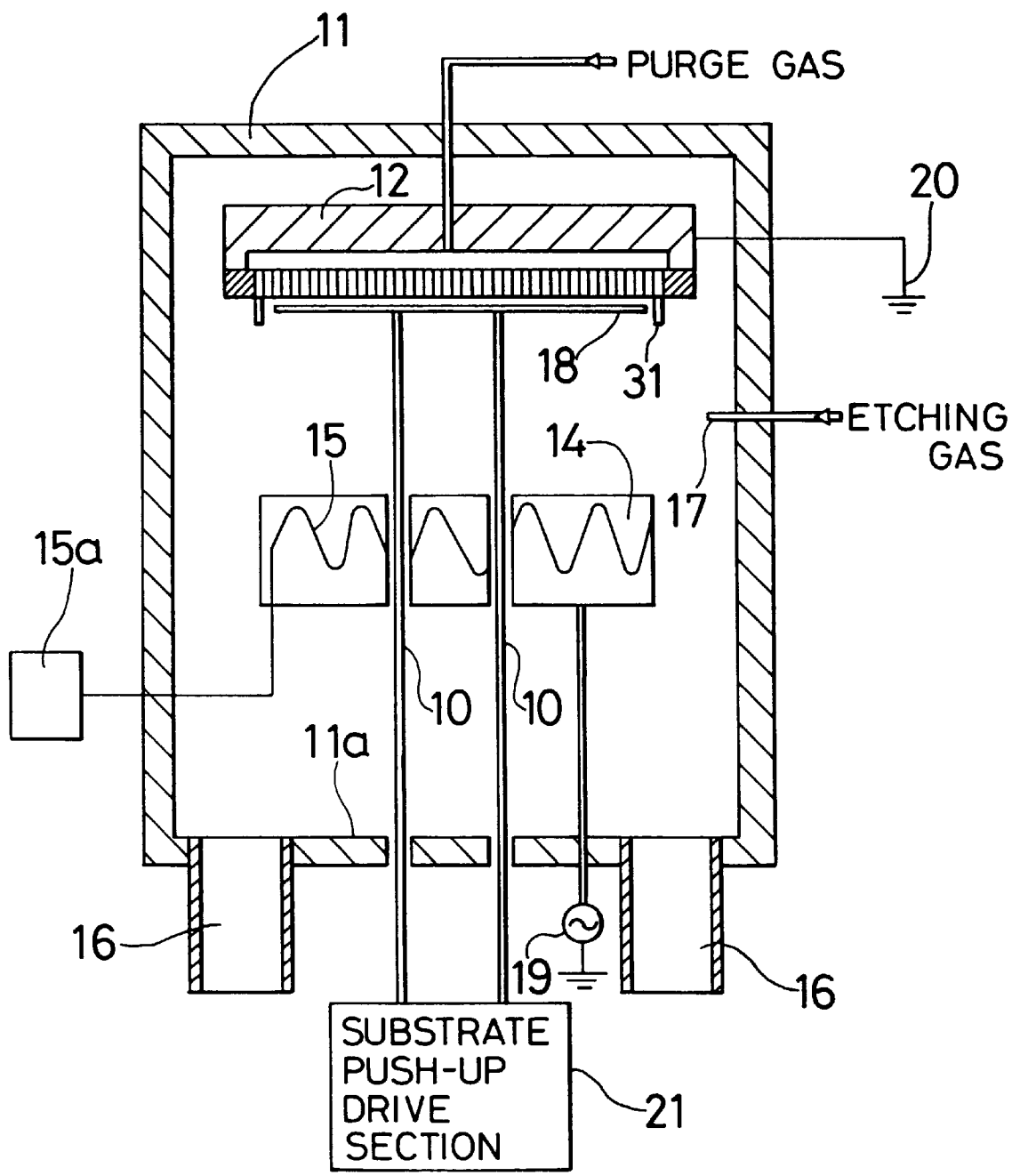
FIG. 2 is a longitudinal sectional view schematically showing a second embodiment of the present invention.

Next, a second embodiment of the present invention will be explained by referring to FIG. 2. The apparatus of the second embodiment is obtained by partially modifying the apparatus of the first embodiment, and is so configured to have a cylindrical member (or a ring member) 31 arranged in the bottom surface of the gas supply plate 13, whose internal diameter is larger than the diameter of the substrate 18, and whose dimension in an axial direction is long enough to cause the substrate 18 lifted by the substrate push-up rods 10 to enter into the inside space thereof. Other configurations of the apparatus of the second embodiment are the same as those of the first embodiment, and therefore the detailed explanations as to the other configurations are omitted.

In the process of removing the tungsten thin film in this embodiment, the substrate 18 is lifted by the push-up rods 10 from the substrate holder 14 and is moved close to the gas supply plate 13 in the same way of the first embodiment, and further the substrate 18 is inserted into the inside space of the cylindrical member 31. The intervals between the gas supply plate 13 and the front surface of the substrate 18 and between the cylindrical member 31 and the peripheral-edge of the substrate 31 are held to be equal to or less than the distance of 1 mm which makes it impossible to generate a plasma. Afterwards, the purge gas and the etching gas are respectively introduced through the gas supply section 12 and the etching gas supply section 17, and later the rf electric power is applied to the substrate holder 14 in order to generate the plasma between the substrate holder 14 and the cylindrical member 31. The plasma causes the part of the etching gas to become ions or radicals. Although the radicals tend to diffuse into the space between the peripheral-edge of the substrate 18 and the cylindrical member 31, as mentioned in the first embodiment, however, the radical is prevented from entering to the front surface of the substrate 18 by means of the purge gas blown off from the gas supply plate 13 with the suitably adjusted flow. The cylindrical member 31 provided to the apparatus of this embodiment can prevent the purge gas from flowing into the reactor directly.

Further, in the present embodiment, the diffusion amount of the radicals can be controlled by suitably adjusting a height of the cylindrical member 31, that is, the length in its axial direction. As to the control on the diffusion amount of the radicals, it is decreased when increasing the length of the cylindrical member 31, while it is increased when decreasing the length. Thus, the amount of the radicals diffusing on the area from the peripheral-edge to the inside on the front surface of the substrate 18 can be controlled by the height (the length in the axial direction) of the cylindrical member 31 and the flow rate of the purge gas, and furthermore thereby the etching range close to the peripheral-edge of the substrate 18 can be controlled. As mentioned above, thus, the tungsten thin films built up on the back surface and the peripheral-edge side of the substrate 18 can be removed independently, and the removal of the tungsten thin film deposited on the front surface can be prevented. As a result of an experiment in accordance with the second embodiment whose conditions are the same as those of the first embodiment, only the tungsten thin films built up on the back surface and the peripheral-edge side of the substrate 18 were completely removed without removing the tungsten thin films deposited on the front surface thereby.

In addition, the actual dimensions of the cylindrical member 31 are: 152 mm for its inside diameter, 36 mm for its height, and 2 mm for its thickness, for example.

Figure 3:
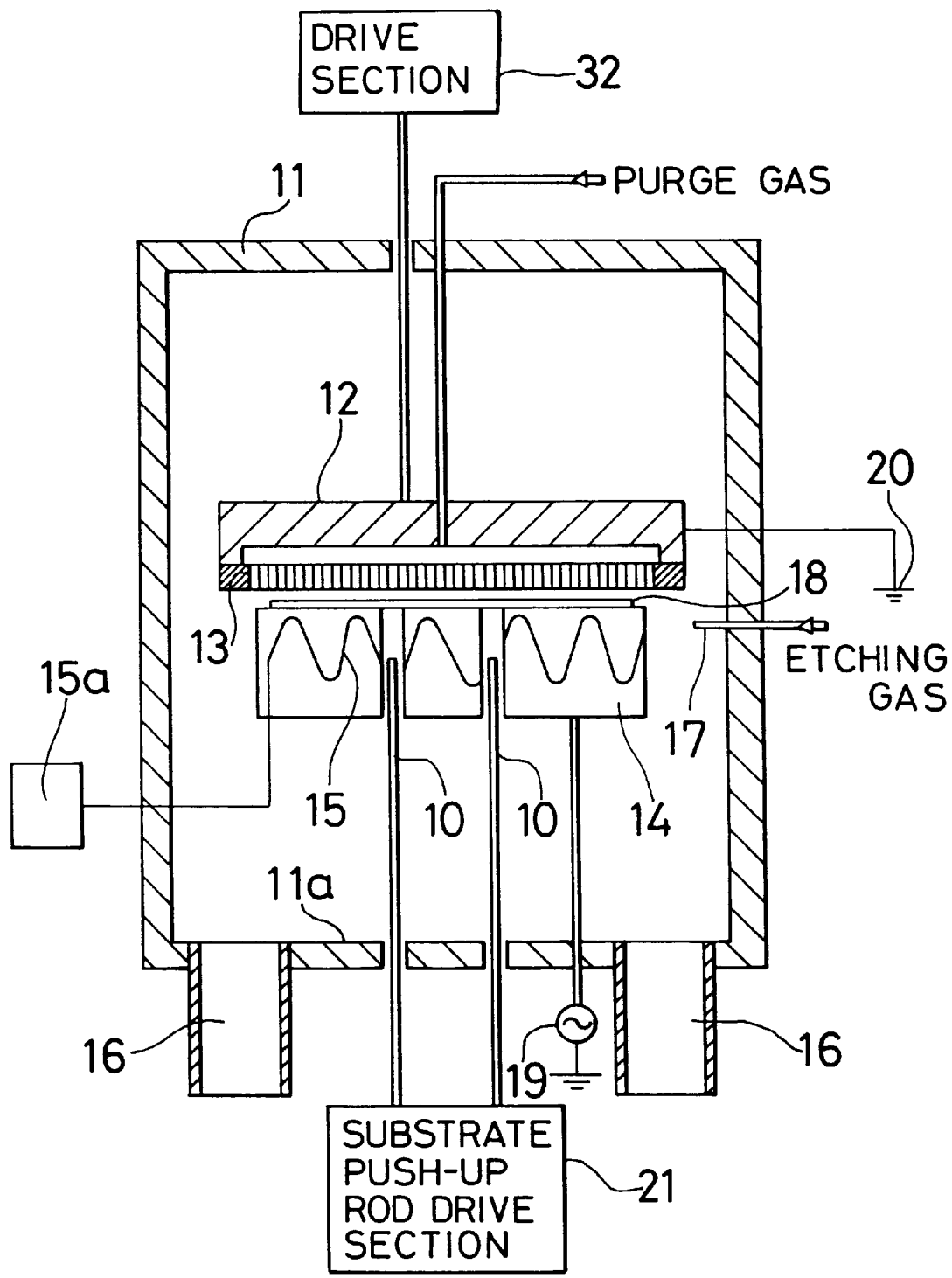
FIG. 3 is a longitudinal sectional view schematically showing a third embodiment of the present invention.

Next, the third embodiment of the present invention will be explained by referring to FIG. 3. The apparatus for processing a substrate according to the third embodiment is for depositing the blanket-tungsten film e.g. onto the entire front surface of the substrate by means of the CVD method in the same way as the first embodiment. In FIG. 3, components being substantially the same as those shown in FIG. 1 have the same respective reference numerals.

The CVD apparatus of the present embodiment is provided with a drive section 32 for moving the gas supply section 12 arranged at an upper position in the reactor 11. The gas supply section 12 and the gas supply plate 13 go down to the substrate 18 loaded on the substrate holder 14 based on the operation of the drive section 32. In case of the present embodiment, unlike the first embodiment, the substrate push-up drive section 21 is used only for loading the substrate 18 on the substrate holder 14 before the film deposition process and taking the substrate 18 off from the substrate holder 14 after the thin film removal process, and is not used for the thin film removal process. The etching gas introduction section 17 arranged to the side wall of the reactor 11 is almost just beside the substrate holder 14. Other configurations in the third embodiment are almost like the first embodiment.

In the third embodiment, like the first example, after a desired tungsten thin film is deposited onto the entire front surface of the substrate 18, the process of removing the tungsten thin films on the back surface and the peripheral-edge side of the substrate 18 is carried out. In the removal process, at first, the gas supply section 12 is moved downward to the substrate 18 kept to be fixed on the substrate holder 14 by the drive section 32 and the interval between the gas supply plate 12 and the front surface of the substrate 18 is kept to be equal to or less than the distance of 1 mm, which can not cause a plasma to be generated. Afterwards, only the tungsten thin films on the back surface and the peripheral-edge side of the substrate 18 are removed by utilizing the purge gas supplied from the gas supply section 12, and in addition the removal of the thin film deposited on the region from the peripheral-edge to the inside area on the front surface of the substrate 18 is prevented. The removal of the tungsten thin films deposited on the back surface of the substrate 18 can be performed by radicals entering into the gaps between the substrate 18 and the substrate holder 14, which are formed between them due to incomplete contact. Further, when the substrate is fixed on the substrate holder 14 by means of a vacuum chuck device e.g., the peripheral-edge section of the substrate 18 is deformed to be apart from the substrate holder and the deformation results in the thin film deposition on the back surface of the substrate 18. Accordingly, the configuration of the present embodiment is suitable for the removal of the deposits produced in the above-mentioned case.

As to the configurations of the above-mentioned third embodiment, as a result of an experiment performed under conditions the same as those of the first embodiment, the only tungsten thin films deposited on the back surface and the peripheral-edge side of the substrate 18 were completely removed without removing the same deposited on the front surface thereof.

Figure 4:
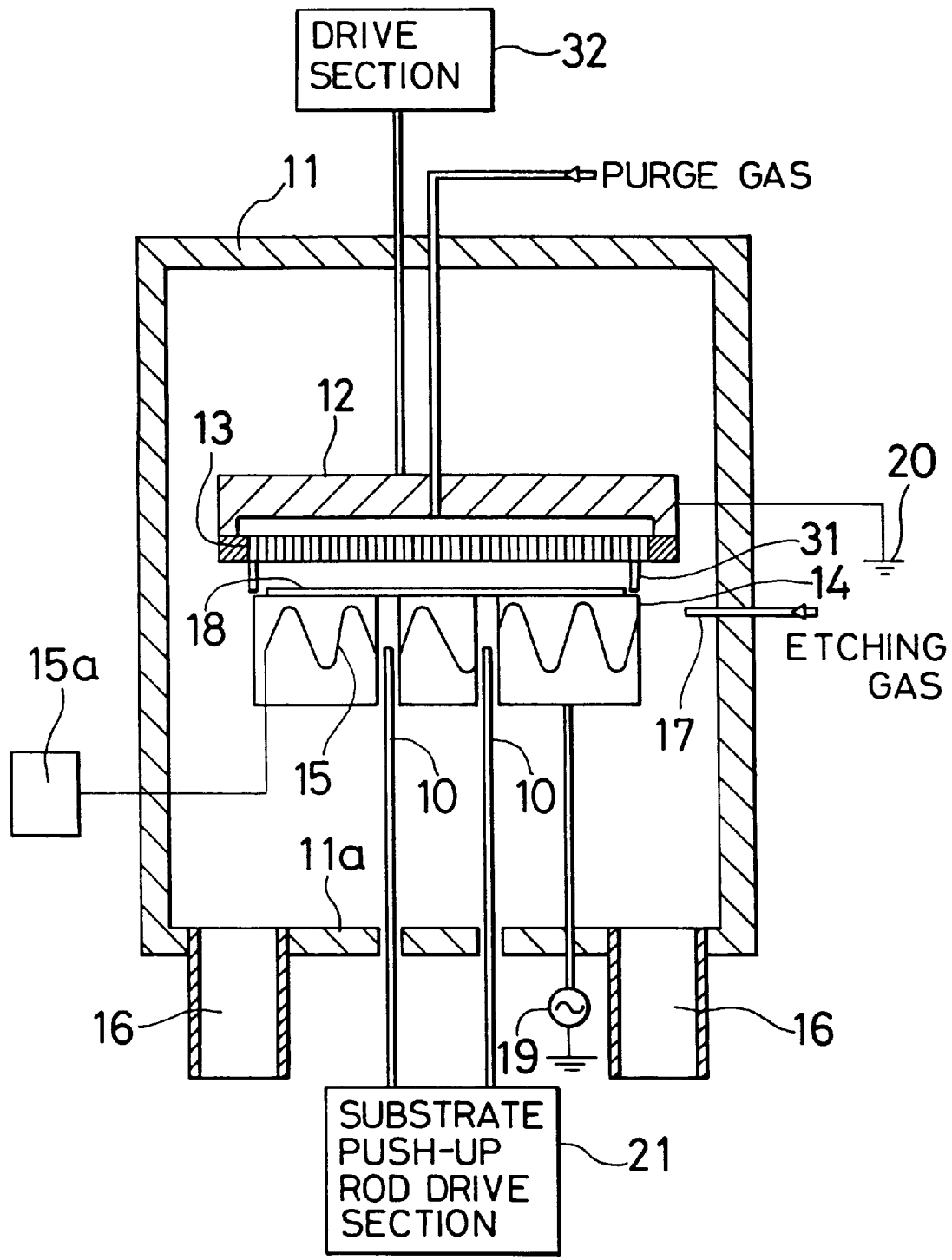
FIG. 4 is a longitudinal sectional view schematically showing a fourth embodiment of the present invention.
Figure 5:
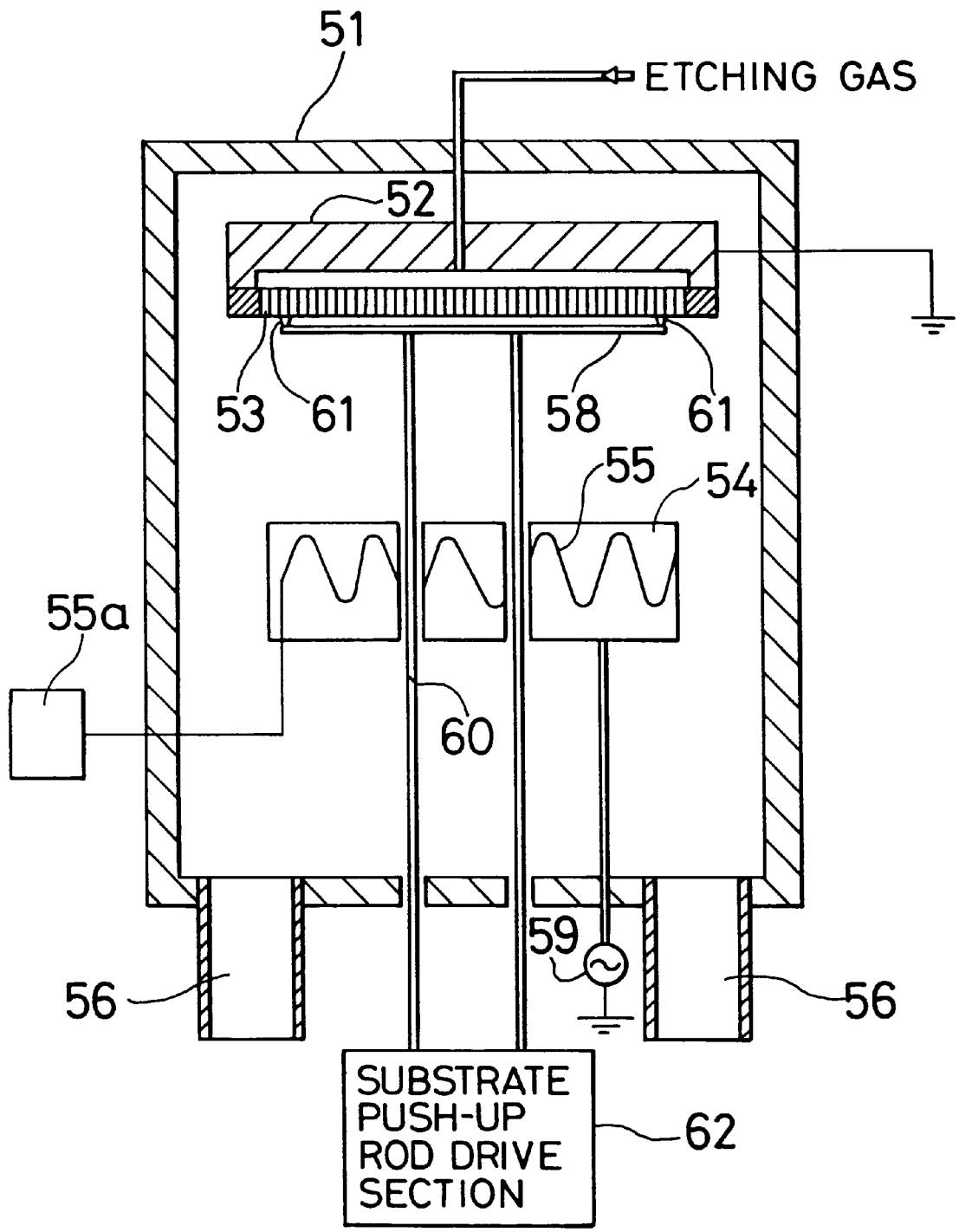
FIG. 5 is a longitudinal sectional view schematically showing a conventional apparatus for processing a substrate.

Next, the fourth embodiment of the present invention will be explained by referring to FIG. 4. The apparatus of this embodiment is a modification of the third embodiment. The apparatus of this embodiment is configured by combining the configuration of the third embodiment shown in FIG. 3 with the cylindrical member 31 explained in the second embodiment. That is, the apparatus for processing a substrate according to this embodiment is so configured that the cylindrical member 31 having the structural features explained in the second embodiment is arranged on the substrate-facing surface of the gas supply plate 13, and both the gas supply section 12 and the gas supply plate 13 can be moved downward to the substrate 18 by the drive section 32. Other configurations in the fourth embodiment are almost like the first embodiment.

In accordance with the fourth embodiment, in addition to the operation and technical effect described in the third embodiment, the operation and technical advantageous effect based on the cylindrical member 31 produces good results. The detailed explanation as to the operation and technical effect of the third embodiment is omitted here. The operation and technical effect based on the cylindrical member 31 is, as explained in the second embodiment, to prevent the purge gas from directly flowing from the gas supply plate 13 to the reactor 11 by suitably adjusting the height of the cylindrical member 31 and to suitably prevent the radicals from entering to the front surface of the substrate 18. The diffusion amount of the radicals on the front surface of the substrate can be controlled by the purge gas and therefore the etching range in the peripheral-edge of the substrate is also controlled. In addition, the tungsten thin films deposited on the back surface and the peripheral-edge side of the substrate can be removed independently.

In each of the above-mentioned embodiments, the thin film deposition onto the substrate and the unnecessary thin film removal on the back surface and the peripheral-edge side of the substrate are both carried out in the same reactor. However, the both processes can be separately carried out in different reactors.

What is claimed is:

1. A method of processing a substrate in a reactor, comprising:
   depositing a thin film onto the substrate by a CVD method; and
   subsequently removing deposits on a back surface and a peripheral-edge side of said substrate by a process for removing the deposits after depositing the thin film including:
      moving a gas supply surface of a gas supply mechanism and a front surface of said substrate relatively toward each other to decrease an interval between said gas supply surface and said front surface and to maintain said gas supply surface and said front surface in a non-contact state;
      supplying an etching gas into a back space of said substrate to generate a plasma in the back space; and
      supplying a purge gas into a front space between said gas supply surface and said front surface from said gas supply surface so that said purge gas flows into the back space of said substrate through the peripheral-edge of said substrate, and said purge gas prevents radicals in the plasma from diffusing into the front space between said gas supply surface and said front surface of said substrate.

2. A method of processing a substrate as claimed in claim 1, wherein the decreasing comprises moving said substrate close to said gas supply surface.

3. A method of processing a substrate as claimed in claim 1, wherein the decreasing comprises moving said gas supply surface close to said substrate.

4. A method of processing a substrate as claimed in claim 1, wherein a distance between said gas supply surface and said substrate is equal to or less than 1 mm.

5. A method of processing a substrate as claimed in claim 1, further comprising arranging a member around said substrate placed close to said gas supply surface to prevent said radicals from diffusing to the front surface of said substrate.

6. A substrate processing apparatus for depositing a thin film onto a front surface of a substrate on a substrate holder by a CVD method, comprising:
   a purge gas supply mechanism having a gas supply surface from which a purge gas is blown off;
   an approach driving mechanism for decreasing an interval between said substrate and said gas supply surface; and
   an etching gas supply mechanism for supplying an etching gas into a space between said purge gas supply mechanism and said substrate holder;
   wherein, after a thin film deposition process, the interval between said substrate and said gas supply surface is decreased by said approach driving mechanism, and said etching gas is supplied into a back space of said substrate by said etching gas supply mechanism so as to generate a plasma, and said purge gas is supplied into said space between said supply surface and said substrate from said supply surface of said etching gas mechanism so that said purge gas flows into the back space of said substrate through a peripheral-edge of said substrate, and said purge gas prevents radicals in the plasma from diffusing into the space between said gas supply surface and said substrate.

7. A substrate processing apparatus as claimed in claim 6, wherein said approach driving mechanism moves said substrate close to said gas supply surface.

8. A substrate processing apparatus as claimed in claim 6, wherein said approach driving mechanism moves said gas supply surface close to said substrate.

9. A substrate processing apparatus as claimed in claim 6, wherein a distance between said gas supply surface and said substrate is equal to or less than 1 mm.

10. A substrate processing apparatus as claimed in claim 6, further comprising a cylindrical member fixed to said gas supply surface and arranged around said substrate placed close to said gas supply surface to prevent said radicals from diffusing to the front surface of said substrate.

11. A method of processing a substrate in a reactor, comprising:
   depositing a thin film onto a front surface, peripheral-edge side and back surface of the substrate by a CVD method; and
   subsequently removing deposits on the back surface and the peripheral-edge side of the substrate by a process for removing the deposits including:
      moving a gas supply surface and a front surface of the substrate relatively toward each other to decrease an interval between the gas supply surface and the front surface and to maintain a distance between the gas supply surface and the front surface;
      supplying an etching gas into a back space of the substrate to generate a plasma in the back space; and
      supplying a purge gas from the gas supply surface into a front space of the substrate between the gas supply surface and the front surface so that said purge gas flows into the back space of the substrate through the peripheral-edge of the substrate, and the purge gas prevents radicals in the plasma from diffusing into the front space of the substrate in a direction opposite to a flow direction of the purge gas.

12. A method of processing a substrate according to claim 1, wherein the distance between the gas supply surface and the front surface of the substrate is sufficiently small to prevent plasma generation in the front space of the substrate.

* * * * *